United States Patent [19]

Tran et al.

[11] Patent Number: 5,598,421
[45] Date of Patent: Jan. 28, 1997

[54] METHOD AND SYSTEM FOR TRACKING THE STATE OF EACH ONE OF MULTIPLE JTAG CHAINS USED IN TESTING THE LOGIC OF INTERGRATED CIRCUITS

[75] Inventors: Dan T. Tran; Wayne C. Datwyler, both of Laguna Niguel; Long V. Ha, Walnut, all of Calif.

[73] Assignee: Unisys Corporation, Blue Bell, Pa.

[21] Appl. No.: 390,712

[22] Filed: Feb. 17, 1995

[51] Int. Cl.$^6$ .................................................. G01R 31/28
[52] U.S. Cl. .......................................................... 371/22.3
[58] Field of Search ................................ 371/22.1, 22.2, 371/22.3, 22.4, 22.5, 22.6, 27; 324/73.1, 158.1, 537, 73 R, 763; 364/580, 579, 578; 365/201

[56] References Cited

U.S. PATENT DOCUMENTS

| | | | |
|---|---|---|---|
| 4,604,746 | 8/1986 | Blum | 371/25 |
| 4,621,363 | 11/1986 | Blum | 371/25 |
| 4,688,222 | 8/1987 | Blum | 371/25 |
| 5,260,947 | 11/1993 | Posse | 371/22.3 |
| 5,285,453 | 2/1994 | Gruodis | 371/27 |
| 5,333,139 | 7/1994 | Sturges | 371/22.3 |
| 5,465,259 | 11/1995 | Hanafusa et al. | 371/22.3 |
| 5,517,637 | 5/1996 | Bruce, Jr. et al. | 395/500 |

*Primary Examiner*—Robert W. Beausoliel, Jr.
*Assistant Examiner*—Stephen C. Elmore
*Attorney, Agent, or Firm*—Alfred W. Kozak; Mark T. Starr; Steven R. Petersen

[57] ABSTRACT

The logic circuitry of an IC chip is connected to JTAG register chains which hold state information on each portion of the logic circuitry therein. A JTAG Tracker Module is connected to the controls of each of the JTAG register chains enabling a programmer-operator to read the present state of each JTAG register chain and enabling a readout of the logic circuits condition in a single clock period.

6 Claims, 6 Drawing Sheets

METHOD AND SYSTEM FOR TRACKING THE STATE OF EACH ONE OF MULTIPLE JTAG CHAINS USED IN TESTING THE LOGIC OF INTERGRATED CIRCUITS

FIELD OF THE INVENTION

This invention relates to testing of integrated circuit chip systems where predesigned specialized logic is embedded in the chip for testing and diagnostic purposes.

BACKGROUND OF THE INVENTION

With the extremely high rate of production and use of integrated circuits in computers and other types of digital module operations, designers have been increasingly aware that methods for testing and diagnosing the internal structure and operations of integrated chips is a necessary and important function.

Desirability of initiating standards for embedding logic circuitry into integrated chips has been proposed and developed by the IEEE committees which have proposed a boundary scan architecture designated IEEE 1149.1. This boundary scan architecture involves placing a chain of registers around the periphery of integrated circuits in order to allow the device input/output (I/O) to be controlled and observed by means of a four-wire serial scan bus. Thus, the registers for multiple devices can be connected in series to form a complete path through all the devices either completely within the integrated circuit chip or can also be used for providing a serial scan on an entire board holding integrated circuit devices.

Figure 6:
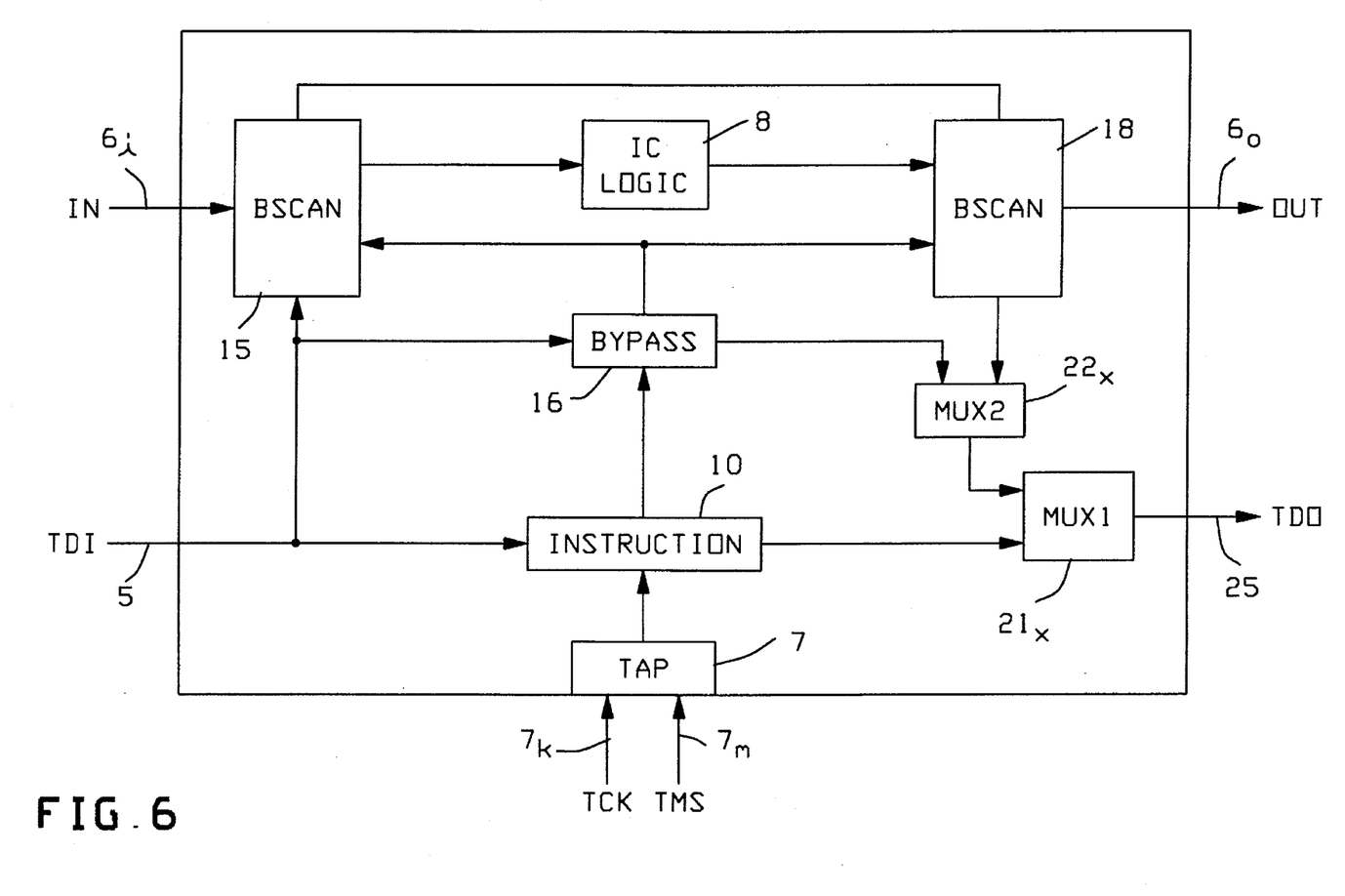
FIG. 6 is a drawing used to illustrate a typical prior art architecture using boundary scan registers to analyze logic circuitry in an integrated circuit chip.

The proposed IEEE 1149.1 standards define operations allowing a sampling of boundary values during "normal operation" in order to observe data flow and also to select a scan bypass register to provide a single-bit scan path through a device. Thus, as seen in the attached FIG. 6, the IEEE standard provides an integrated circuit (ICN) level test framework consisting of a four-wire Test Access Port (TAP) controller 7 and the related scan path architecture as shown in FIG. 6.

The Test Access Port (TAP) controller 7 receives external control inputs by means of a Test Clock (TCK) on line $7_k$ and also a Test Mode Select (TMS) signals on line $7m$. It then provides output control signals to the internal scan paths.

Absent the requirement for embedded testability, the normal integrated circuit logic would be represented by the block 8 where data could be fed in on line $6_i$ and routed out on line $6_o$.

However, by adding in the auxiliary embedded logic into the chip, it is then possible to provide testability of the chip for integrity in addition to being able to readout the various state conditions of each of the logic circuits 8. As seen in FIG. 6, the scan path architecture will be seen to have a single serial instruction register 10 and two or more serial data registers 15 and 18. These are called Boundary Scan Registers (BSR). Thus, as seen in FIG. 6, the data registers 15, 18 are called a Boundary Scan Registers and the data register 16 is called a Scan Bypass Register.

The instruction register 10 and the Boundary Scan Data Registers 15 and 18 are connected in parallel between a serial TDI (Test Data Input) signal line 5 and a serial TDO (Test Data Output) signal on line 25.

The TDI input line 5 in FIG. 6 is connected directly to the serial inputs of the instruction register 10, and the Data Registers 15 and 18. The Test Data Output on line 25 (TDO) can receive its signals from several sources, namely: from the instruction register 10, from the bypass register 16 via multiplexer $22_x$ and multiplexer $21_x$, or the test data output line 25 may receive data from the Boundary Scan Register 18 through multiplexer $22_x$ and multiplexer $21_x$.

The selective control signals for the multiplexer $21_x$ is supplied by the TAP (Test Access Port) controller 7. The selection control signals for the multiplexer $22_x$ comes from the instruction register 10.

When "boundary testing" is not being performed, the Boundary Scan Registers 15 and 18 are "transparent" and out of the circuit, thus allowing the input signals and the output signals to pass to and from the Integrated Circuit (IC) logic 8.

However, during "boundary testing" in FIG. 6, the Boundary Scan Registers 15 and 18 will disable the normal flow of data between input $6_i$ and output $6_o$ in order to allow boundary signals of integrated circuit, IC 8, to be controlled and observed by means of scanning operations.

Thus, there is provided the ability to sample data passing through the I/O boundary of an integrated circuit or groups of integrated circuits, thus allowing the designers to take a snapshot of the logic states within the integrated circuit or within a group of integrated circuits on a printed circuit board without removing the board from its container.

The concept involved here is often called built-in testability (BIT). Thus, by providing the greater control and observability of the internal nodes in the normal Integrated Circuit (IC) logic 8, this allows a system to be tested much more efficiently with smaller test programs, shorter execution times and greater fault coverage. This efficiency can reduce the time and expense on test generation during verification or debug, thus allowing more rapid and more reliable testing.

In addition to checking the hardware, the enhanced accessibility of the "states" of the internal nodes can simplify application software testing and hardware/software integration. Thus, software designers can use the test bus 5 in FIG. 6 to download code in order to target various elements in the hardware and to monitor their response. With this increased observability, this makes it easier to sort out the hardware/software from integration problems. Thus, while many earlier systems required debug and testing to occur by means of pulling out suspected printed circuit boards or suspected integrated chips out of the system and putting in new ones in order to correct system problems in the field, in the presently described system, the maintenance can be carried out internally and diagnostically, thus to eliminate the necessity for carrying spare boards and IC chips which would be used for replacing defective boards and chips.

The designation JTAG refers to an architecture proposed by the Joint Test Action Group (JTAG) which specifies a four-wire test bus and boundary scan architecture for embedding around the logic circuitry of an integrated circuit chip. This enables the linking of integrated circuit logic to enable testing and diagnosis. These type built-in test features are specified in IEEE Standard 1149.1 (Test Standards Committee).

SUMMARY OF THE INVENTION

A series of Boundary Scan Data Registers are embedded in an integrated circuit chip and connected to the logic circuitry in order to sense the "state" or logical condition of each portion of the circuitry at any given moment of time.

A maintenance processor feeds input data into the logic circuitry of the integrated chip and reads out this data for testing and diagnostic purposes.

A state machine tracking module is connected so as to tap into each one of the input lines fed to the integrated circuit chip in order to indicate each input set of signals which will be reflected in the state of each one of various sets of boundary scan data registers.

Figure 5:
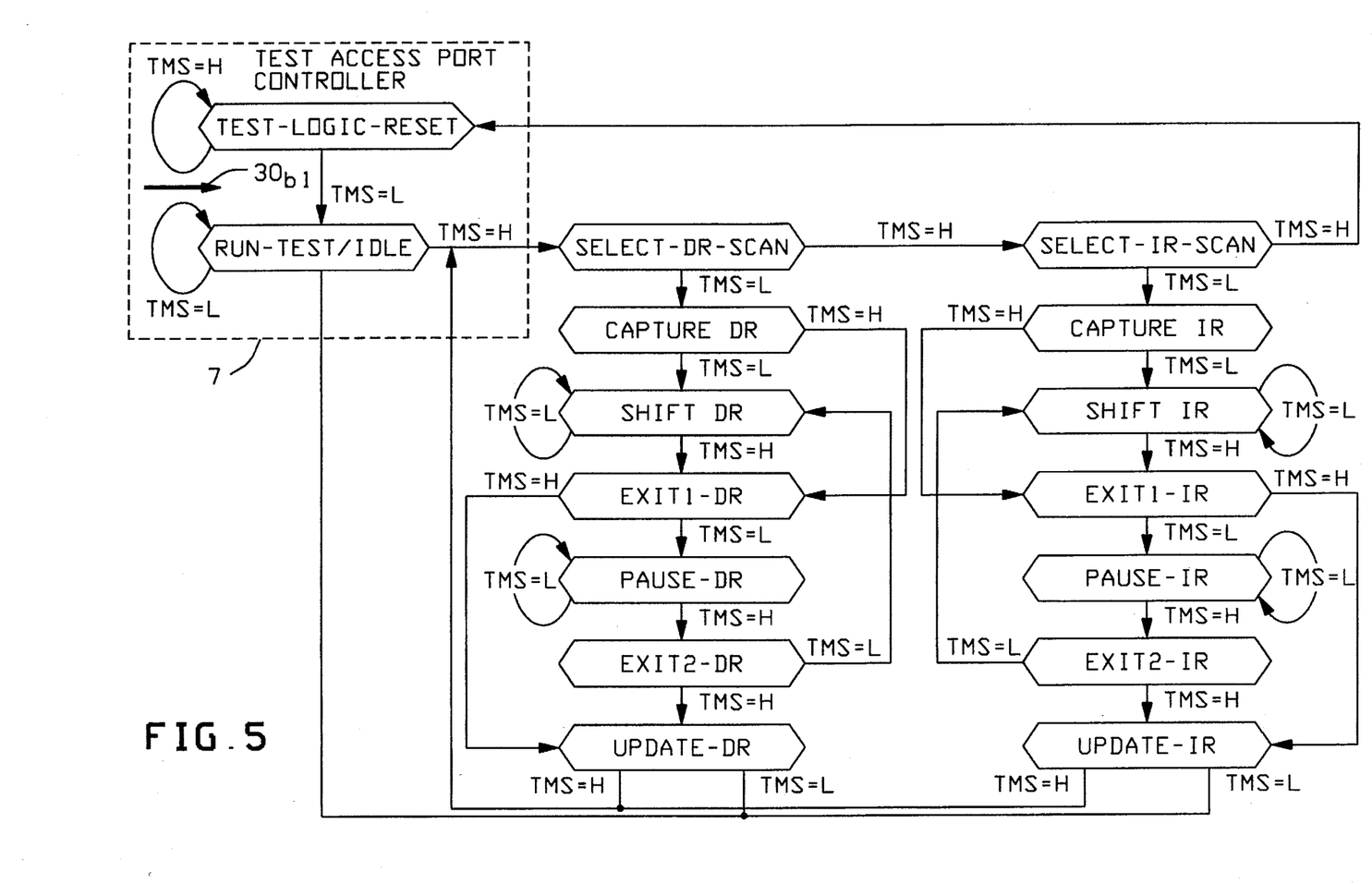
FIG. 5 is a schematic drawing of the test access port controller having registers which indicate various states of logic information in a shift chain.

As seen in FIG. 5, there is indicated a number of "states" or conditions which reflect the operability and viability of the logic units on a chip.

In prior usage, the programmer had the problem of either keeping track of each state of each JTAG register chain in some associated data base or else the programmer had to program the JTAG register chain to the "objective" state by first programming to the "idle" state and then proceeding to the "objective" state. This was time consuming. The present system permits the programmer to go directly from a "known" present state over to the objective state directly without the previously required sequence of steps. The rest of the data base access overhead is eliminated by reading directly from an associated JTAG state machine tracker. This can be done because the system allows the programmer to know precisely the "state" of the JTAG register chain at any instant.

DESCRIPTION OF PREFERRED EMBODIMENT

Figure 1:
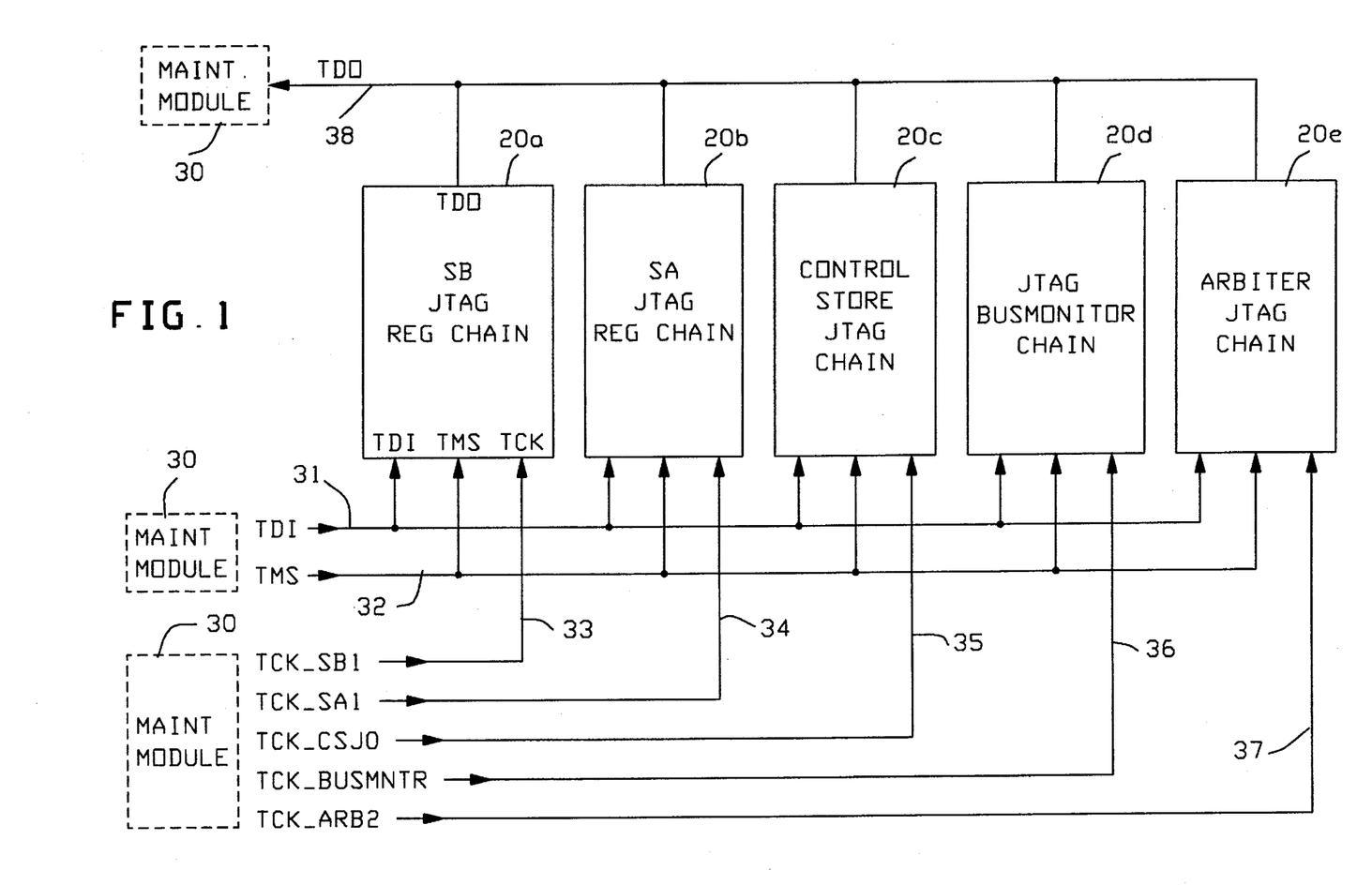
FIG 1 is simplified drawing of multiple boundary scan register chains used in the prior art which hold state information on logic circuitry in an integrated circuit chip.

Referring to FIG. 1, there is seen a series of JTAG boundary scan data registers designated $20_a$, $20_b$, $20_c$, $20_d$, $20_e$. The JTAG Boundary Data Registers can be situated in one Integrated Circuit (IC) or several Integrated circuits connected in series. These boundary scan registers are embedded in an integrated circuit chip and will each be connected to and sense the condition of various combinative logic circuits within the integrated circuit chip.

Under normal operating conditions of the chip, these JTAG boundary scan registers $20_{a-e}$ are invisible and do not influence the normal operation of the chip. However, during "test mode conditions", the normal inputs and outputs of the integrated circuit chip are nullified and specialized test signals are inserted by a maintenance processor 30 into the various boundary scan data registers $20_a$, $20_b$, etc. wherein each of these boundary scan registers will monitor a portion of the internal logic of the integrated circuit chip and thus, at any time, be able to sense the condition of that portion of the logic.

Figure 2:
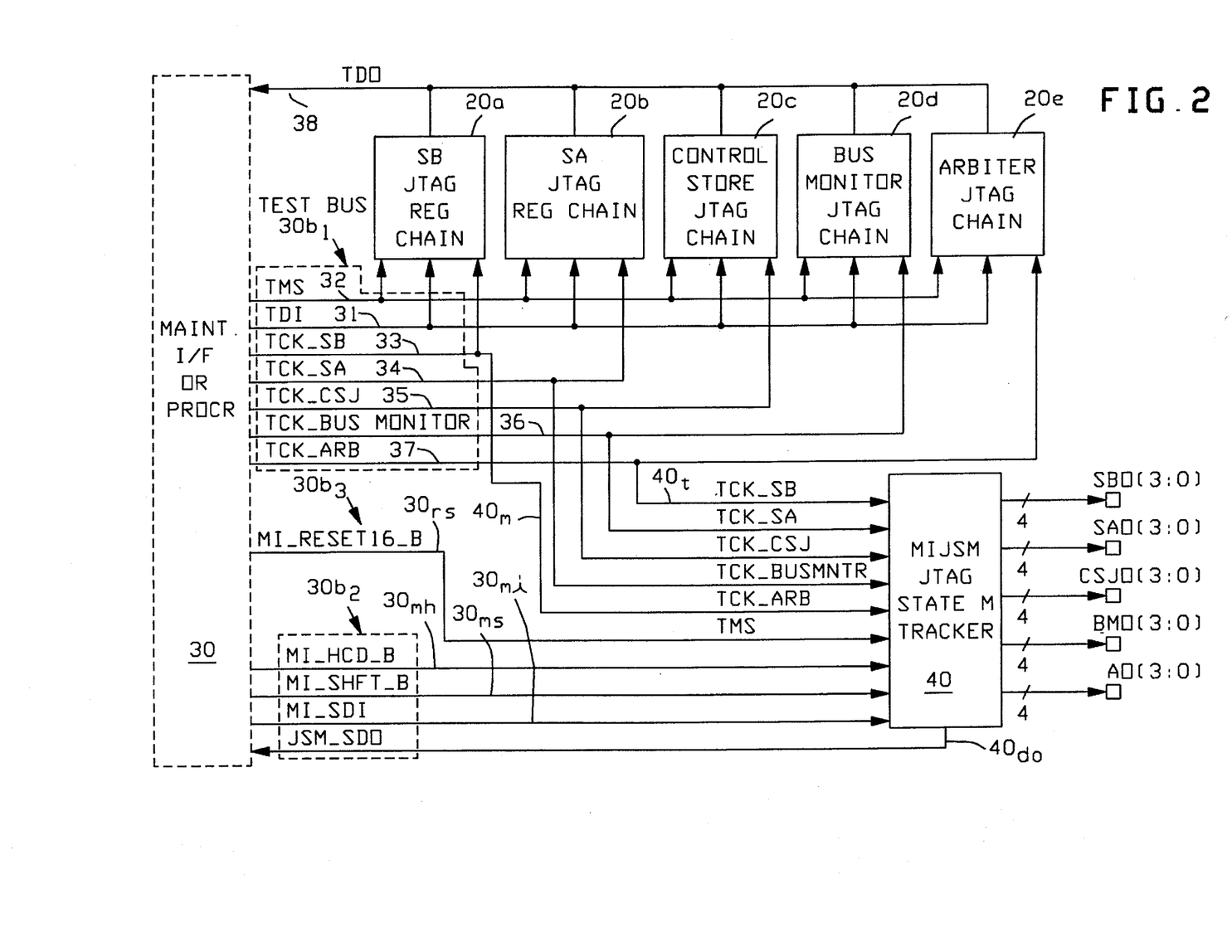
FIG. 2 is a diagram indicating a newly developed State Machine Tracker for rapidly observing the state of any given state register in a JTAG shift chain.

The maintenance processor 30 controls the JTAG signals to the various sections of the combinational logic of the integrated circuit chip. In FIG. 1, these are shown where (i) $t_{ck}$ is the JTAG clock; (ii) $t_{ms}$ is the Test Mode Select; (iii) TDI (tdi) is the Test Data Input. The signals $t_{ck}$ and $t_{ms}$ control the state of the JTAG chain. These input signals in FIG. 1 from the Maintenance Interface Processor 30 are shown in FIG. 2 on lines 31 through 37. Thus, the outputs 38 (TDO=tdo) of each of the series of boundary scan registers 20 will feed information back to the maintenance interface processor 30 where the data can be analyzed for proper operation or for detection of errors in function.

A specialized state machine designated as the State Machine Tracker 40, shown in FIG. 2, is connected in parallel to each of the lines 32–37 which the maintenance-interface processor 30 feeds to the boundary scan registers 20. The State Machine Tracker 40 then is aware of each state or status condition that the maintenance processor has fed to each of the boundary scan registers 20 because it is looking at $t_{ms}$ and $t_{ck}$; and $t_{ms}$ and $t_{ck}$ controls the state of the JTAG registers. The boundary scan registers, which were generally indicated as "20" are actually composed, as seen in FIG. 2, of $20a$ (SBJTAG chain); of $20b$ (SAJTAG chain); of $20c$ (Control Store JTAG chain); of $20d$ (Bus Monitor JTAG chain); of $20e$ (Arbiter JTAG chain). The output bus $40_{do}$ of the State Machine Tracker 40 can then feed back the status information to the maintenance processor 30 so that a programmer can know precisely the state of each of the JTAG register chains at any given moment of time.

The Maintenance Interface Processor 30 controls the JTAG Shift signals using the Test Data Input (TDI) line 31, the Test Mode Select (TMS) signal line 32 and the clock (TCK) lines 33–37 (FIG. 1, 2). These lines constitute the Test Bus $30b1$.

The Maintenance Interface Processor 30 also controls the regular shift signals shown on bus $30_{b2}$ of FIG. 2 involving the hold line $30_{mh}$, the shift line $30_{ms}$, the serial data-in line, $30_{mi}$, and input serial data out-line, $40_{do}$, from the State Machine Tracker 40.

An additional control line is the reset line $30_{rs}$ for the signal MI_RESET16_B used to reset the State Machine Tracker 40 to its initial state. This is part of the bus $30b3$ coming from the Maintenance Interface 30.

In prior art operations, the programmer either had to keep track of the state of each of the JTAG register chains (boundary scan registers 20) by storing them in a specialized data base, or he then had to program the chain to the "idle" state and then proceed back again to the "objective" state. Either of these options was time consuming and unwieldy and difficult for the programmer to perform this operation.

The "idle" state operates by having the test mode select (TMS=$t_{ms}$) at the "high" (H) for five clock ($t_{ck}$) periods. This gets any state condition back to the test logic reset (TLR) which is the "idle" condition (Table III).

The "objective" state is the state which is illustrated in FIG. 5 which indicates the states available by each of the blocks indicated. For example, this might be the state designated "Shift-IR" seen in FIG. 5.

The method and system provided by the present disclosed configuration allows the programmer to go directly from the known present state to the "objective" state directly, without need to go to the "idle" state and then go to the "objective" state. In the past practice in this situation, the programmer was required to keep track of the various states of each of the JTAG boundary scan registers by placing them in specific data bases and then he had to refer to that data base before knowing what the present state was for each register and before he could program it to change it to the "objective" state.

With the present arrangement, the data base, which could be considered as an overhead item, is thus eliminated because the programmer can read the "objective" state directly from the added hardware JTAG State Machine Tracker 40.

In the usual prior art situation, the delays and difficulties that a programmer had in programming a chain to go "idle" and then programming a chain of information to go to the "objective" state, would take rather long periods of time. It also took considerable time to read the state of the JTAG chain information from the data base the programmer was required to use if the programmer wanted to go to the objective state directly from the present state.

With the present system, the programmer can go directly to the JTAG State Machine Tracker 40, FIG. 2 and read the existing state of the information chain in each of the JTAG boundary scan registers and then proceed to step the chain to the "objective" state.

Thus, in reference to FIG. 5, the usual and normal system operation was such that the programmer never knew which of the various states of FIG. 5 the system was operating in, and thus it was necessary for the programmer to go to the test logic reset state before going to the objective state. For example, in FIG. 5, if the programmer knew that the present state was "Capture-IR", he could (under the system of FIG. 2) then step the system into a newly desired state such as "Exit1-IR" rapidly in one clock cycle, instead of using the old system where he would have to go to use the Test Logic Reset state and then "step through" each of the sequential steps until he could go to the "Exit1-IR" state.

FIG. 5 is a TAP (Test Access Port) controller state diagram, where serial test information is conveyed by means of a four-wire test bus 30$b1$ and test access port controller (TAP), 7. FIG. 5 shows a typical state diagram for Texas Instruments Company SN54ABT 8245 Scan Test Devices with Octal Bus Transceivers. Test instructions, test data and test control signals are passed along this serial test bus (30$_{b1}$ of FIG. 5). The TAP controller 7 (FIG. 6) monitors two signals from the test bus, these signals being the clock signal (TCK) and the Test Mode Select signal (TMS).

The function of the TAP controller 7 is to extract the synchronization ($t_{ck}$) and the state control signals (TMS) from the test bus 30$b1$ (FIG. 2) and then generate the appropriate on-chip control signals for the test structures in the device. FIG. 5 shows the various state diagrams possible in the TAP controller 7 and those residing in various state test registers.

The TAP controller 7 is fully synchronous to the $t_{ck}$ signal. Input data is captured on the rising edge of the $t_{ck}$ signal and output data changes are captured on the falling edge of the TCK signals. This insures that data to be captured is valid for fully one-half of the TCK cycle.

The four-wire test bus 30$b1$ (FIGS. 5, 6) connects to the Test Logic-Reset and Run-Test/Idle registers.

Functionally, the IEEE Standard 1149.1–1990 uses a four-wire test bus and boundary-scan architecture which show the relationship between the test bus, the TAP controller and the state test registers. This requires an eight-bit instruction register and three test data registers, plus a 36-bit boundary scan register, a 11-bit boundary control register and 1-bit bypass register.

Referring to FIG. 1, there is seen a simplified diagram of the architecture involving a maintenance module 30 and a series of JTAG chains designed 20$_a$, 20$_b$, 20$_c$, 20$_d$, and 20$_e$. Thus, each processor module in a specified computer system is provided with five JTAG chains.

As seen in FIG. 1, these chains include (i) SB JTAG Register Chain 20$a$; (ii) SA JTAG Register Chain 20$_b$; (iii) the Control Store JTAG Register Chain 20$c$; (iv) the Bus Monitor JTAG Register Chain 20$_d$; (v) the Arbiter JTAG Register Chain 20$_e$.

As seen in FIG. 1, each of the chains have a set of test input (tdi) and output (tdo) signals which include: (a) the JTAG serial input data line—tdi 31; (b) the JTAG serial output data line—TDO 38; (c) the JTAG test mode select line—TMS 32; (d) the JTAG clock lines—$t_{ck}$ (33–37).

As will be noted in FIG. 1, the signal lines TDI, TDO, TMS are common to each one of all of the JTAG chains. However, different and unique clock signals ($t_{ck}$'s) are peculiar to each of the chains. Thus, the chain 20$_a$ has an input clock signal designated TCK-sb1 on line 33. The JTAG chain 20$_b$ has a clock signal TCK-sa1 on line 34. The chain 20$_c$ has a clock signal 35 designated tck-csjϕ as input. The chain 20$_d$ has an input clock signal 36 designated TCK-busmntr. The chain 20$_3$ has a clock signal 37 designated $t_{ck}$-arb2.

Now referring to FIG. 2, there is seen the addition of another module designated as the JTAG State Machine Tracker 40. This state machine may be designated by the acronym "MIJSM" for Maintenance Interface JTAG State Machine. This can be implemented by the use of a chip designated 7032 by the Altera Corporation.

Each of the JTAG register chains 20$a$, 20$b$, 20$c$, 20$d$, 20$e$, is made to change its state by the Test Mode Select (TMS) signals and the clock ($t_{ck}$) signals. The Tracker 40 looks at the test mode select (tms) signal that goes to each and every one of the JTAG chains and the clock signals ($t_{ck}$) that go to each of the JTAG chains in order to determine what particular "state" that the JTAG register chain is in. The state of each of the JTAG register chains is stored in the State Machine Tracker module 40 and can be read out by a regular shift chain or else by looking at the output pins (FIG. 4, 55$_{sb3}$, 55$_{sb2}$, 55$_{sb1}$, 55$_{sb0}$ of the State Machine Tracker. These output pins are shown in FIG. 2, schematically, wherein four output lines are designated sb0, (3:0) four output lines are designated sao (3:0), four output lines are designated csjo (3:0), four output lines are designated BMO (3:0) and four output lines are designated ao. Thus, some 20 output pins are available for sensing various of the state conditions within the JTAG State Machine Tracker 40.

The following Table I shows the FIG. 2 inputs to the State Machine Tracker 40, while Table II indicates the FIG. 2 outputs from State Machine Tracker 40.

TABLE I

| INPUTS TO TRACKER 40 | |
|---|---|
| INPUTS | |
| MI_TMS1 | the common test-mode select TMS line that goes to all the JTAG chains |
| $t_{ck}$_SB1 | SB JTAG Register Chain's JTAG Test Clock |
| $t_{ck}$_SA1 | SA JTAG Register Chain's JTAG Test Clock |
| $t_{ck}$_CSJ0 | Control Store JTAG Register Chain's JTAG Test Clock |
| $t_{ck}$_BUSMNTR | Bus Monitor Register Chain's JTAG Test Clock |
| $t_{ck}$_ARB2 | Arbiter JTAG Register Chain's JTAG Test Clock |
| MI_HLD_B | regular shift chain's hold signal |

TABLE I-continued

INPUTS TO TRACKER 40

| INPUTS | |
|---|---|
| MI_SHF_B | regular shift chain's shift signal |
| MI_SDI | regular shift chain's serial data in |
| MI_RESET16_B | reset signal to reset the Tracker to initial state |

TABLE II

OUTPUTS FROM TRACKER 40

| OUTPUTS | |
|---|---|
| JSM_SDO | regular shift chain's serial data out |
| SBO (3:0) | SB JTAG Register Chain's JTAG State |
| SAO (3:0) | SA JTAG Register Chain's JTAG State |
| CSJO (3:0) | Control Store JTAG Register Chain's JTAG State |
| BMO (3:0) | Bus Monitor JTAG Register Chain's JTAG State |
| AO (3:0) | Arbiter JTAG Register Chain's JTAG State |

Figure 4:
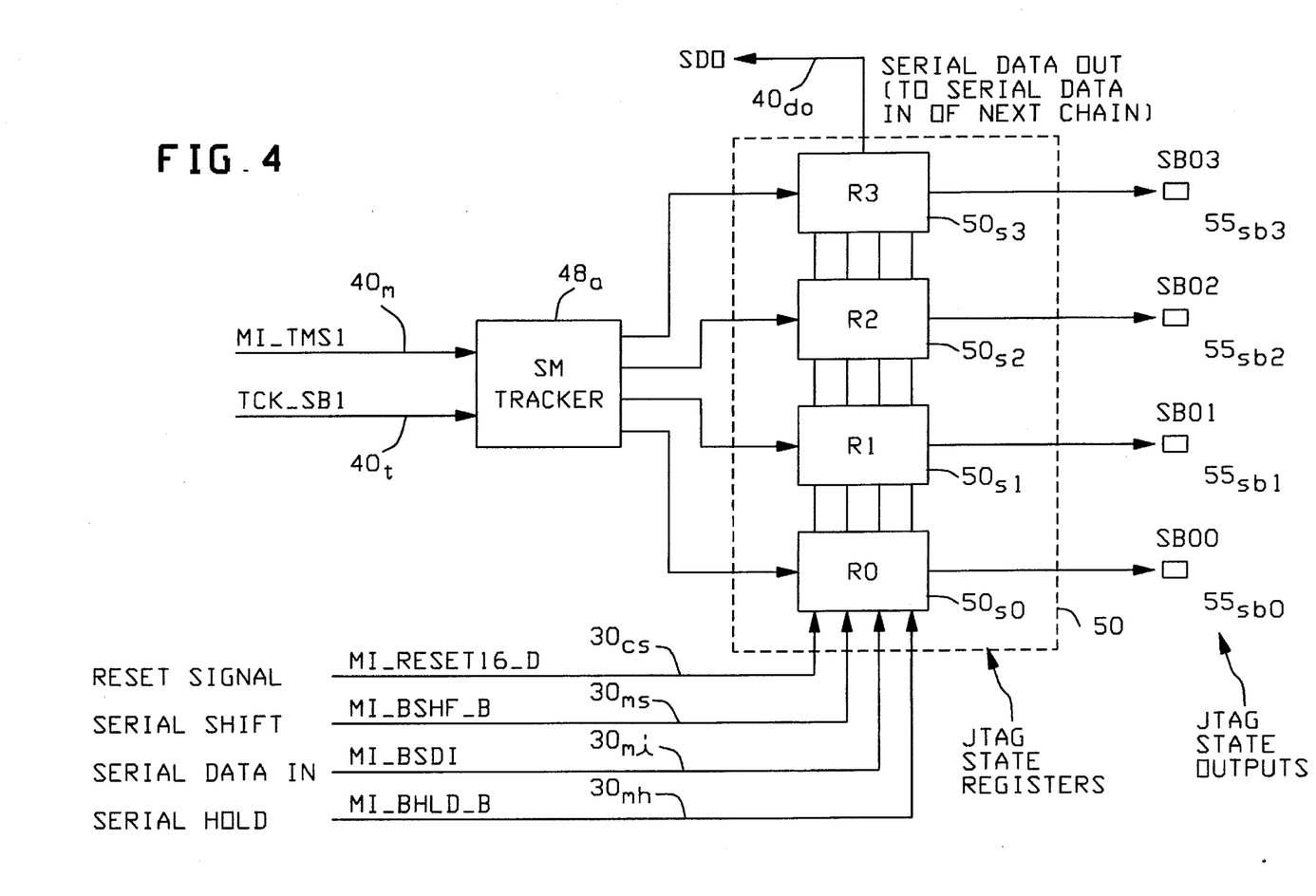
FIG. 4 is a drawing of one portion of the State Machine Tracker with its four register output lines.

Referring to FIG. 4, there is seen the State Machine Tracker 40 block diagram which is applicable to each JTAG chain in FIG. 1 and 2. It will be seen that each JTAG chain 20 has a corresponding set of four-bit output pins from the State Tracker 40 as seen in the lower right-hand corner of FIG. 2. By focusing on one typical set of the four-bit line output from the State Machine Tracker 40, FIG. 4 will now indicate, in more detail, the operative features of each one of the four-bit (four line) outputs from the Tracker A typical example will be illustrated for the boundary scan chain designated SB JTAG Register Chain (20a of FIG. 2).

As seen in FIG. 4, each JTAG chain has a output stack of four registers designated $R_0$, $R_1$, $R_2$ and $R_3$ ($50_{s0}$, $50_{s1}$, $50_{s2}$, $50_{s3}$. The data State Machine Tracker 40 provides an input to each one of these four output registers. As seen in FIG. 4, the State Machine Tracker 40 has two control line inputs designated as MI-TMS1, $40_m$ indicating the test mode select signal and also the clocking signal line $40_t$ designated TCK-SB1. The State Machine Tracker is then able to keep track of, for example, SB register chain 20a and its "state" conditions.

A dotted line is shown around the four, one-bit state registers to indicate that there is a package unit 50 which constitutes the four state registers $50_{s0}$–$50_{s3}$. The "state" outputs of each of the state registers are shown in FIG. 4, whereby the register $R_0$ has a "state" output designated SBO0, the register $R_1$ has a "state" output designated SBO1, the register $R_2$ has a "state" output designated SBO2 and the register $R_3$ has a "state" output designated SBO3.

In FIG. 4, a series of input lines ($30_{rs}$, $30_{ms}$, $30_{mi}$, $30_{mh}$) are fed through the registers in sequence from inputs to register $R_0$ and on through the registers to the register $R_3$ whence the final output SDO on line $40_{do}$ shows the serial data output which constitutes the serial data input to the next chain. Thus, the output SDO from JTAG chain $20_a$ is then fed to JTAG chain $20_b$; the output of $20_b$ is fed to chain $20_c$; the output of $20_c$ is fed to $20_d$, etc.

The input lines feeding to the JTAG state registers $50_{s0}$–$50_{s3}$ are indicated as the reset signal, MI-RESET16-D, $30_{rs}$, the serial shift signal MI-BSHF-B $30_{ms}$, the serial data-in signal $30_{mi}$ designated MI-BSDI, and the serial hold signal designated MI-BHLD-B.

The signal MI-RESET16B resets the State Machine Tracker 40 to its initial state, wherein all the JTAG state outputs are "idle". This is called TLR or Test Logic Reset State.

Each time that a JTAG register chain changes state,, the State Machine Tracker 40 is cognizant of this because it is sensitive to the TMS (Test Mode Select) and the TCK (clock) signals. The State Machine Tracker 40 then will change accordingly and then the JTAG state output will reflect the change.

As an example, a program will change the SB JTAG Register Chain 20a (FIG. 1) from the state TLR (test logic reset) over to the state called Run Test Idle, RTI, by changing the FIG. 4 line $40_m$ MI-TMS1 from "high" to "low" and with the clock FIG. 4 line $40_t$ to change TCK-SB1. The State Machine Tracker 40 (FIG. 4) monitors the line MI-TMS1 40m and the line 40t TCK-SB1 and thus changes the SBO outputs (3:0) from the state TLR (Test Logic Reset) over to the state RTI (Run Test Idle).

Figure 3:
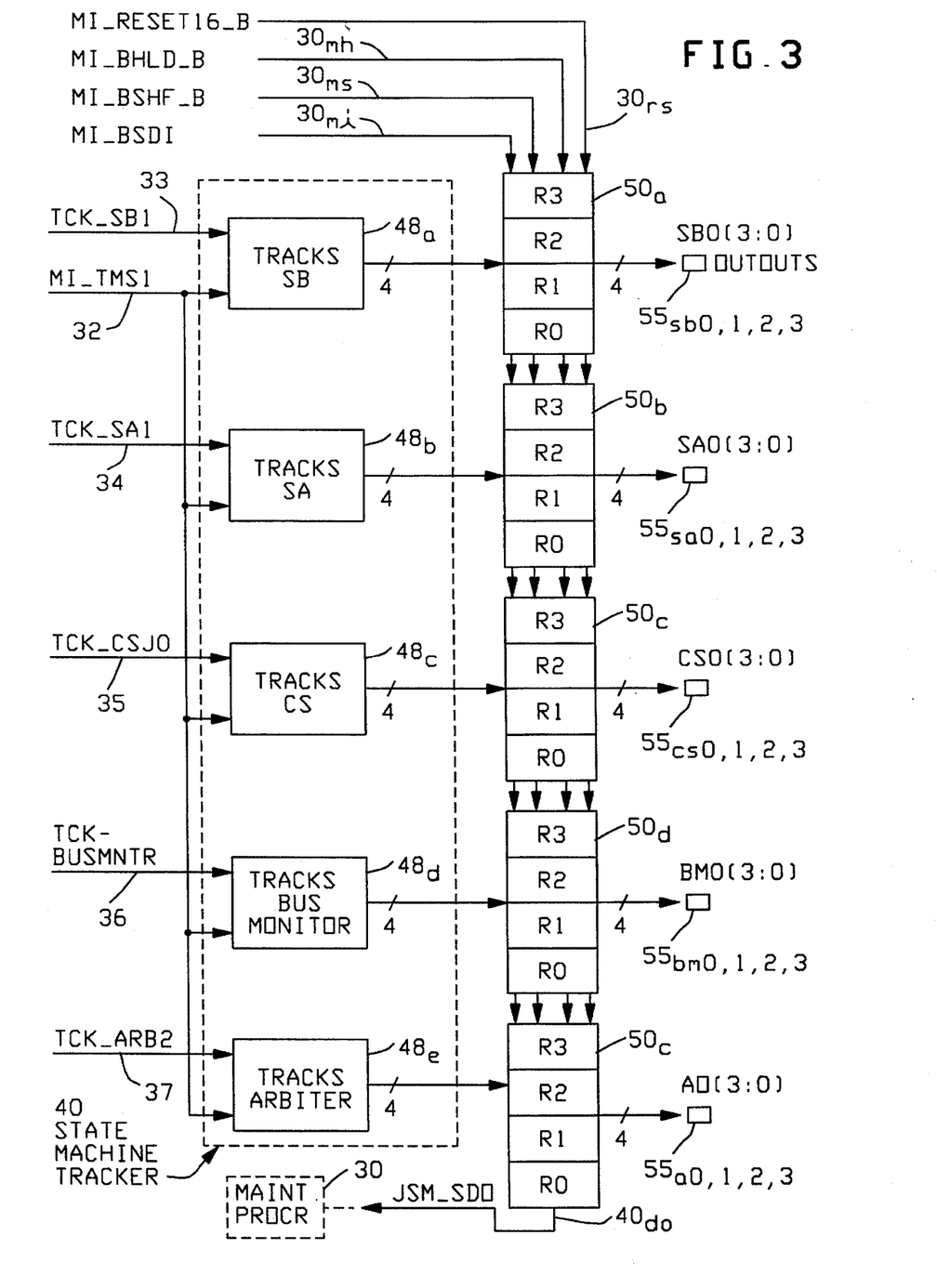
FIG. 3 is a drawing illustrating the architecture of the new State Machine Tracker.

FIG. 3 shows an overall simplified drawing of the architecture of the State Machine Tracker 40 which services all five of the register chains $20_a$–$20_e$.

FIG. 3 will be seen to correlate with FIG. 1 where each of the JTAG register chains $20_a$–$20_e$ has its own corresponding tracker circuit 48 (48a, 48b, 48c, 48d, 48e) in the State Machine Tracker 40. Thus as seen in FIG. 3, the register chain $20_a$ has a tracker circuit $48_a$, the register chain $20_b$ has a tracker circuit $48_b$, the control store chain $20_c$ has a tracker circuit $48_c$, the bus monitor chain $20_d$ has a tracker circuit $48_d$ and the arbiter chain $20_e$ has a tracker circuit $48_e$, within the state machine tracker module 40.

Each of the individual tracker circuits 48 (48a–48e) of FIG. 3 will be seen to have an input from the test mode select signal 32, Mi-TMS1. Additionally, each one of the tracker circuits 48 has an individual input from the various clock circuits 33, 34, 35, 36, 37 designated $t_{ck}$-SB1, $t_{ck}$-SA1, $t_{ck}$-CSJ$\phi$, $t_{ck}$-BUSMNTR and $t_{ck}$-ARB2 (FIGS. 1, 3).

The output of each of the internal tracker circuits $48_a$ ... $48e$ are each individually fed to the state registers $50_a$ ... $50_e$, which result in the four-bit output lines designated SBO (3:0), the four-bit output SAO (3:0), the four-bit output CSO (3:0), the four-bit output BMO (3:0) and the output AO (3:0). These outputs may be connected to output pins $55_{sb,0,1,2,3}$; $55_{sa,0,1,2,3}$; $55_{cs0,1,2,3}$; $55_{bm0,1,2,3}$; $55_{ao,1,2,3}$.

As seen at the top of FIG. 3, a number of input lines $30_{rs}$, $30_{mh}$, $30_{ms}$ and $30_{mi}$ are fed serially through the state registers $50_a$ ... $50_e$. These input lines include the reset line MI-RESET16-B, the line MI-BHLD-B, the shift line MI-BSHF-B, and the shift data input line MI-BSDI. At the opposite end or tail end of the state registers 50, there is an output line $40_{do}$ designated JSM-SDO which represents the serial data output which is fed to maintenance module 30 of FIG. 1.

The JTAG states of all the chains $50_a$, $50_b$, $50_c$, $50_d$, $50_e$ are linked together in a regular serial shift chain. Each JTAG "state" has four bits and since there are five JTAG chains, this renders the total bits in the regular serial shift chain to be 20 bits.

The programmer is able to look at the JTAG states by shifting this regular serial shift chain. The shifting of this chain is accomplished by activating the hold signal MI-BHLD-B ($30_{mh}$ FIG. 4) and then activating the shift signal MI-BSHF-B ($30_{ms}$, FIG. 4) once for each bit involved.

The output serial data will be presented on the serial output signal lines $40_{do}$ JSM-SDO seen in FIGS. 3 and 4.

The registers of the regular shift chains are also available to the outside for analysis by means of the output pins of the device. For example, in FIG. 3, the outputs SBO (3:0) represent the encoding of the SB JTAG Registers current state condition.

The JTAG "state" encoding is available on the regular serial shift chain or on the output pins $55_{sb0}$–$55_{sb3}$ shown on FIGS. 2 and 4 as outputs from the State Machine Tracker 40.

The following Table III is an example of the encoding used for the various states shown in the left-hand column. The State Machine Tracker 40 looks at the test mode select signal (TMS) on each clock (TCK) and changes the state of the JTAG Register Chain accordingly.

For example, if the current state is TLR (test logic reset) and the test mode signal TMS is active "low" when the TCK signal is clocked, then JTAG state would change from TLR (test logic reset) over to RTI (run test idle). Thus, the output pins would then show a change from the encoding "0000" to "0001".

TABLE III

STATE ENCODING

| State | | Encoding |
| --- | --- | --- |
| TLR | Test Logic Reset | 0000 |
| | | "Idle State" |
| RTI | Run Test Idle | 0001 |
| SDS | Select DR Scan | 0010 |
| CDR | Capture DR | 0011 |
| SDR | Shift DR | 0100 |
| E1DR | Exit 1 DR | 0101 |
| PDR | Pause DR | 0110 |
| E2DR | Exit 2 DR | 0111 |
| UDR | Update DR | 1000 |
| SIS | Select IR Scan | 1010 |
| CIR | Capture IR | 1011 |
| SIR | Shift IR | 1100 |
| E1IR | Exit 1 IR | 1101 |
| PIR | Pause IR | 1110 |
| E2IR | Exit 2 IR | 1111 |
| UIR | Update IR | 1001 |

Note:
DR = Data Register
IR = Instruction Register

As indicated in FIG. 5, there are 16 states which are labeled within the blocks of FIG. 5 and indicate the 16 states reflective of each JTAG Register Chain.

For example, in FIG. 3, the four-bit output SBO (3:0) might have an encoded output of "0000" which indicates that JTAG Chain SB($20_a$) is in the test logic reset (TLR) state. This state block is indicated at the top left of FIG. 5 (Test Logic—Reset).

For example, if the programmer should desire to find out whether a JTAG Chain is in "idle" state, he would read the regular shift chain and see the indication that SB0 (3:0) is encoded with the output of "0000".

The programmer can know when he can operate in the "objective" state of a JTAG chain. As an example, if the programmer sees he is in the state of "Capture-IR" (FIG. 5) which is also seen in Table III as "1011", and the programmer wants to go to the state of "Exit1-IR" (1101), the programmer needs only to have the test mode select ($t_{ms}$) signal equal to "one" (high) and then use the clock ($t_{ck}$) once only.

If the programmer does not have the present state machine tracker module, the programmer will not know that he is in the "Capture-IR" state, and thus he is required to go back to the TLR (test logic reset) state (0000) by having the test mode select ($t_{ms}$) equal to "one" (high) and then to run the clock ($t_{ck}$) up to five clock times. Then, the programmer must have the Test Mode Select ($t_{ms}$) signal read "1101" (Exit 3-IR) together with five $t_{ck}$ clocks in order to step from the TLR state over to the "Exit1-IR" state. This is a much longer, cumbersome process than having the ability to use the state machine tracker to immediately know what the present "state" is and then merely step (in one clock) to the desired "state" readout.

Thus, the overall advantage provided to the programmer involves (1) he is able to program in a much more rapid fashion without needing to go back to the "idle" state, and (2) the programmer has a system that stores the states of each of the JTAG chains and can thus use these easily for debugging purposes.

Described herein has been an enhancement to a computer system having a number of JTAG register chains wherein there is provided a method to keep track of the state of each of the JTAG chains. In this fashion, the programmer can know precisely the state of any one of the JTAG Register Chains at any instant.

Thus, previously the programmer had to either keep track of the state of each JTAG Register Chains by using an external data base or the programmer had to program the JTAG Register Chain to its objective state by first programming it to its idle state and then proceeding to its objective state which was a time-consuming situation. However, with the use of the State Machine Tracker in conjunction with the JTAG chains, the programmer can go directly from a known present state to the objective state thus saving considerable time and eliminating the need for an external data base. Thus, the data base access overhead is eliminated since the programmer can read directly from the hardware JTAG State Machine Tracker.

While the preferred embodiment of the above-described State Machine Tracker system has been indicated, it should be understood that the concept of the more efficient tracking of the states of the JTAG Register Chains may be accomplished with other embodiments or methodology but which still fall within the concept of the above invention as defined by the following claims.

What is claimed is:

1. In a plurality of JTAG register chains having a Data Register and Instruction Register for holding status information on a plurality of logic elements wherein said register chains are set in an idle or an operative Run state, said logic elements having JTAG register chains for reading the condition of said logic elements, a system for selectively reading out the present state of any logic element in any one of said JTAG registers, said present state including a digital code which reflects the current JTAG state condition for a Data Register or Instruction Register, comprising:

(a) means for setting said JTAG register chains into the operative Run state;

(b) tracking means for reading out the presently existing said present state of any one of said logic element's JTAG register chain including:

(b1) a dedicated state machine tracker for each one of said JTAG register chains which provides a coded output which indicates the specific JTAG present state occurring in that JTAG register chain;

(c) means for shifting the said presently known readout present state in order to provide a readout of a newly selected JTAG register state.

2. The system of claim 1 wherein said tracking means for readout of a selected JTAG register state can be read out for display in one clock period.

3. The system of claim 1 which includes:

(a) maintenance processor means for shifting test data input, clock signals and test mode select signals into each of said JTAG register chains;

(b) test data output lines for conveying the state conditions of each said JTAG register chain to said maintenance processor.

4. The system of claim 3 wherein said maintenance processor means includes:

means for diagnosing the operation of said logic elements by readout of the status of each register in each said JTAG register chain.

5. In an integrated circuit chip having multiple operative logic elements connected to multiple JTAG boundary scan registers which hold a digitally encoded state condition for each of said logic elements, a system for tracking and reading out the said digitally encoded state of any selected logic element comprising:

(a) means for feeding test data into said multiple operative logic elements;

(b) means for reading out said test data from said multiple operative logic elements;

(c) a plurality for multiple JTAG registers each forming a JTAG register chain with each register holding digitally encoded state information reflective of one of said logic elements;

(d) a plurality of JTAG state machine tracker means for sensing the digitally encoded state of each JTAG register chain and for enabling rapid readout of any selected present state condition in any of said JTAG registers.

6. In a digital network having multiple integrated circuits each of which has a dedicated JTAG register chain for testing and diagnosing said integrated circuits wherein each said JTAG register chain operates through 14 states such that 7 states are sequenced for a data register and 7 states are sequenced for an instruction register using the standard 7-step sequence provided by the JTAG IEEE Standard 1149.1, a system for sensing the present state condition of each JTAG register chain comprising:

(a) means for using a digital bit code to establish each state of said 7 data register sequences and 7 instruction register sequences plus codes for an Idle state and Run Test state;

(b) means for setting each of said JTAG registers into said Run Test state;

(c) means for stepping said Data Register and said Instruction Register through said sequence of 7 states;

(d) JTAG tracker means including:

(d1) a dedicated JTAG tracker for monitoring each one of said dedicated JTAG register chains;

(d2) readout means for reading out the said digital bit code indicating the present state of a selected one of said dedicated JTAG register chains;

(e) means for shifting the state of any one of said JTAG register chains from its presently known state to a desired subsequent state.

* * * * *